(12) United States Patent
Williams et al.

(10) Patent No.: US 7,994,421 B2
(45) Date of Patent: Aug. 9, 2011

(54) PHOTOVOLTAIC DEVICES HAVING NANOPARTICLE DIPOLES FOR ENHANCED PERFORMANCE AND METHODS FOR MAKING SAME

(75) Inventors: George M. Williams, Portland, OR (US); David M. Schut, Philomath, OR (US); Andreas Stonas, Albany, OR (US)

(73) Assignee: Voxtel, Inc., Beaverton, OR (US)

( * ) Notice: Subject to any disclaimer, the term of this patent is extended or adjusted under 35 U.S.C. 154(b) by 399 days.

(21) Appl. No.: 12/290,660

(22) Filed: Oct. 30, 2008

(65) Prior Publication Data

US 2009/0211629 A1    Aug. 27, 2009

Related U.S. Application Data

(60) Provisional application No. 60/983,642, filed on Oct. 30, 2007.

(51) Int. Cl.
*H01L 31/00* (2006.01)
*H01L 21/00* (2006.01)

(52) U.S. Cl. .......... 136/256; 136/261; 438/63; 977/773; 977/778; 977/813

(58) Field of Classification Search .................. 136/256, 136/261; 438/63, 69; 257/E31.003; 977/754, 977/773, 778, 813, 815–819, 821
See application file for complete search history.

*Primary Examiner* — Jennifer K. Michener
*Assistant Examiner* — Eli S Mekhlin
(74) *Attorney, Agent, or Firm* — Lumen Patent Firm

(57) ABSTRACT

A photovoltaic device has nanoparticles sandwiched between a conductive substrate and a charge selective transport layer. Each of the nanoparticles has a ligand shell attached to the nanoparticle core. A first type of ligand is electron rich and attached to one hemisphere of the nanoparticle core, while a second type of ligand is electron poor and attached to an opposite hemisphere of the core. Consequently, the ligand shell induces an electric field within the nanoparticle, enhancing the photovoltaic effect. The arrangement of ligands types on different sides of the nanoparticle is obtained by a process involving ligand substitution after adhering the nanoparticles to the conductive substrate.

5 Claims, 8 Drawing Sheets

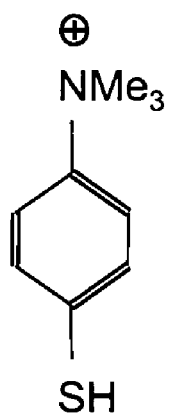
*Fig. 6A*
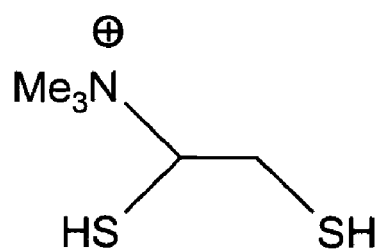
*Fig. 6B*
*Fig. 6C*
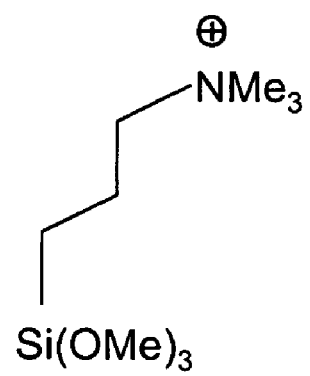

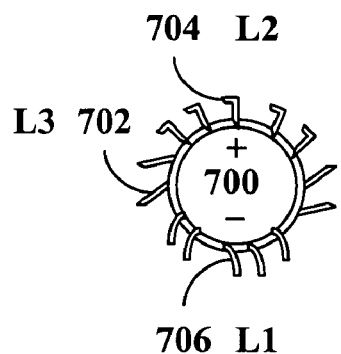
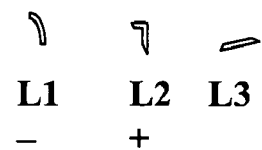
*Fig. 7B*
*Fig. 7A*
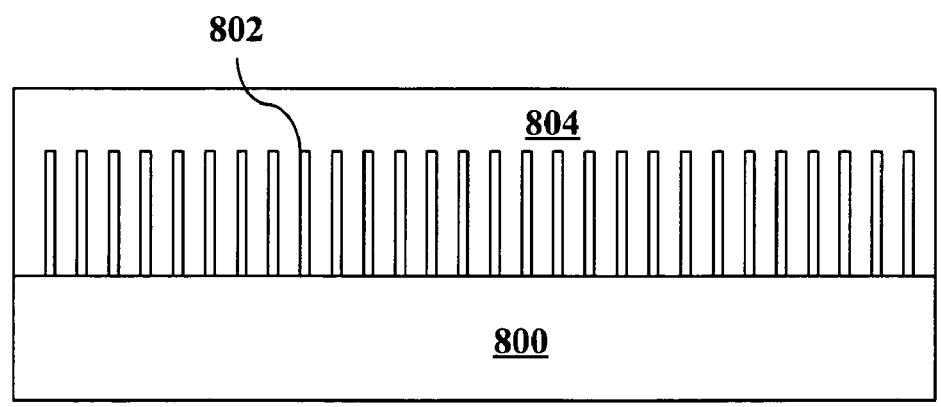
*Fig. 8*

US 7,994,421 B2

PHOTOVOLTAIC DEVICES HAVING NANOPARTICLE DIPOLES FOR ENHANCED PERFORMANCE AND METHODS FOR MAKING SAME

CROSS-REFERENCE TO RELATED APPLICATIONS

This application claims priority from U.S. provisional patent application No. 60/983,642 filed 30 Oct. 2007, which is incorporated herein by reference.

STATEMENT OF GOVERNMENT SPONSORED SUPPORT

This invention was made with Government support under contract DE-PS36-07G097025 awarded by the Department of Energy. The US Government has certain rights in this invention.

FIELD OF THE INVENTION

The present invention relates generally to photovoltaic devices and methods for producing photovoltaic materials. More specifically, it relates to photovoltaic materials having nanoparticles and methods for making them.

BACKGROUND OF THE INVENTION

Photovoltaic materials such as solar cells operate on the basis of the photovoltaic effect. In the case of photovoltaic materials including nanoparticles, it is known that incident light can produce multiple excitons within a nanoparticle. However, to take advantage of multiple excitons to produce increased device performance, it is necessary to enhance the photovoltaic effect in such materials by separating and extracting the charge resulting from the excitons. Unfortunately, known materials do not provide such an enhancement.

SUMMARY OF THE INVENTION

The present invention provides, in one aspect, a photovoltaic device including nanoparticles having enhanced photovoltaic effect. A nonuniform distribution of electron rich and electron poor ligands on the nanoparticle surface induce an electric field in the nanoparticle. The induced dipole allows for the stabilization of multiple charges within the nanoparticle, providing increased time for allow for charge separation and extraction, thereby enhancing the photovoltaic effect and providing superior device performance.

According to one aspect, a photovoltaic device is provided that includes a conductive substrate, a charge selective transport layer, and nanoparticles sandwiched between the conductive substrate and the charge selective transport layer. The nanoparticles are bonded to the transparent conductive substrate and are in electrical contact with the charge selective transport layer. Each of the nanoparticles preferably has a nanoparticle core and a ligand shell attached to the nanoparticle core. The ligand shell has two types of ligands. The ligands of the first type are electron poor and attached to one hemisphere of the nanoparticle core, while the ligands of the second type are electron rich and attached to an opposite hemisphere of the core. Consequently, the ligand shell induces an electric field within the nanoparticle.

In preferred embodiments, the conductive substrate has a transparent conductive oxide substrate and a plurality of metal oxide nanorods fabricated on the transparent conductive oxide substrate. Additionally, the nanoparticle core preferably is composed of an inner core material surrounded by a shell material, where the shell material's band gap is larger than the inner core material's band gap. Preferably, the ligands of the first type bond the nanoparticles to the conductive substrate, and the ligands of the second type bond the nanoparticles to the charge selective transport layer.

The present invention provides, in one aspect, a method for producing a photovoltaic device having nanoparticles with an induced electric field. At least two challenges are overcome by the present method. First, it is difficult to create a nonuniform distribution of ligands on the surface of a nanoparticle. Second, even if such a nonuniform distribution were created, diffusive exchange would soon result in a uniform distribution. The present method provides a technique for producing a stable nonuniform distribution of different ligand types on the surface of nanoparticles in a photovoltaic device.

According to another aspect, a method is provided for making a photovoltaic device. The method includes: surface functionalizing a conductive substrate with bifunctional ligands of a first type; surface functionalizing nanoparticles with ligands of a third type; adhering the surface functionalized nanoparticles to the surface functionalized conductive substrate by ligand exchange of a portion of the ligands of the third type for ligands of the first type; performing ligand substitution to replace a portion of the ligands of the third type on the adhered surface functionalized nanoparticles with ligands of a second type; and introducing a charge-selective transport layer in electrical contact with the ligands of the second type. The first, second, and third ligands are distinct types of ligands. In particular, the ligands of the first type are electron rich and the ligands of the second type are electron poor. Preferably, the method also includes synthesizing metal oxide nanorods on a transparent conductive oxide to produce the conductive substrate.

BRIEF DESCRIPTION OF THE DRAWINGS

FIGS. 6A, 6B, and 6C illustrate examples of ligands of a second type used to functionalize the nanoparticles, according to a preferred embodiment of the invention.

FIG. 7A is a schematic illustration of a nanoparticle having electron rich ligands bonded to one hemisphere and electron poor ligands bonded to an opposite hemisphere, thereby inducing an electric field in the nanoparticle, according to a preferred embodiment of the invention.

FIG. 7B is a schematic illustration of three types of ligands used for surface functionalization, according to a preferred embodiment of the invention.

FIG. 8 is a schematic illustration of a photovoltaic device that includes a conductive substrate made of a transparent conductive oxide and a plurality of metal oxide nanorods, and a charge selective transport layer, according to a preferred embodiment of the invention.

DETAILED DESCRIPTION

Figure 1A:
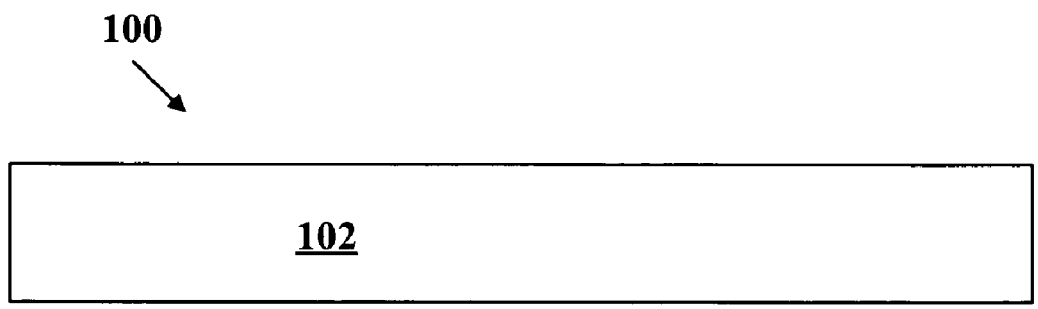
FIG. 1A is a schematic illustration of a conductive substrate, according to one embodiment of the invention.
Figure 1B:
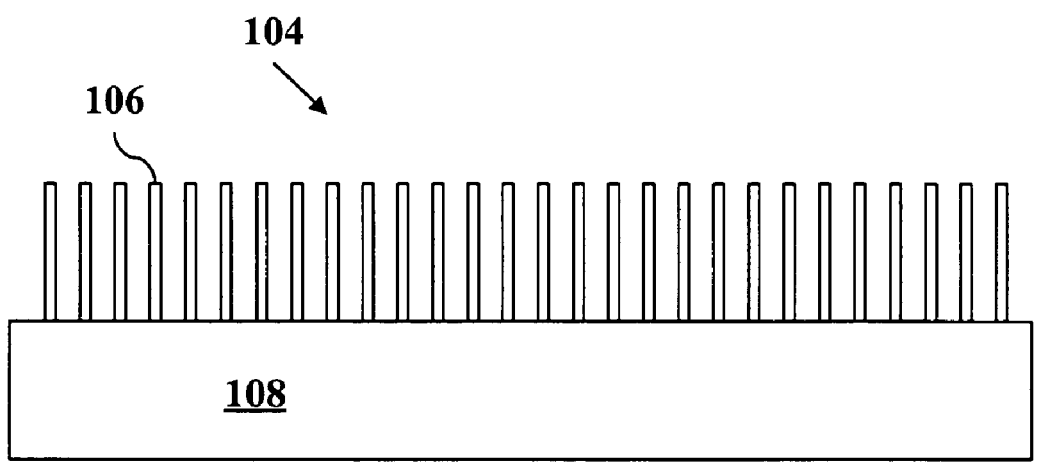
FIG. 1B is a schematic illustration of a conductive substrate made of nanowires synthesized on a transparent conductive oxide, according to a preferred embodiment of the invention.

According to a preferred embodiment of the invention, a photovoltaic device is made by a collection of steps which will be described now in relation to the figures. In one step, a conductive substrate is surface functionalized with bifunctional ligands of a first type. In one embodiment, as shown in FIG. 1A, the conductive substrate 100 is a transparent conductive oxide substrate 102 such as $TiO_2$. In a preferred embodiment, shown in FIG. 1B, the conductive substrate 104 is produced in a prior step by synthesizing metal oxide nanorods 106 on a transparent conductive oxide substrate 108.

Figure 1C:
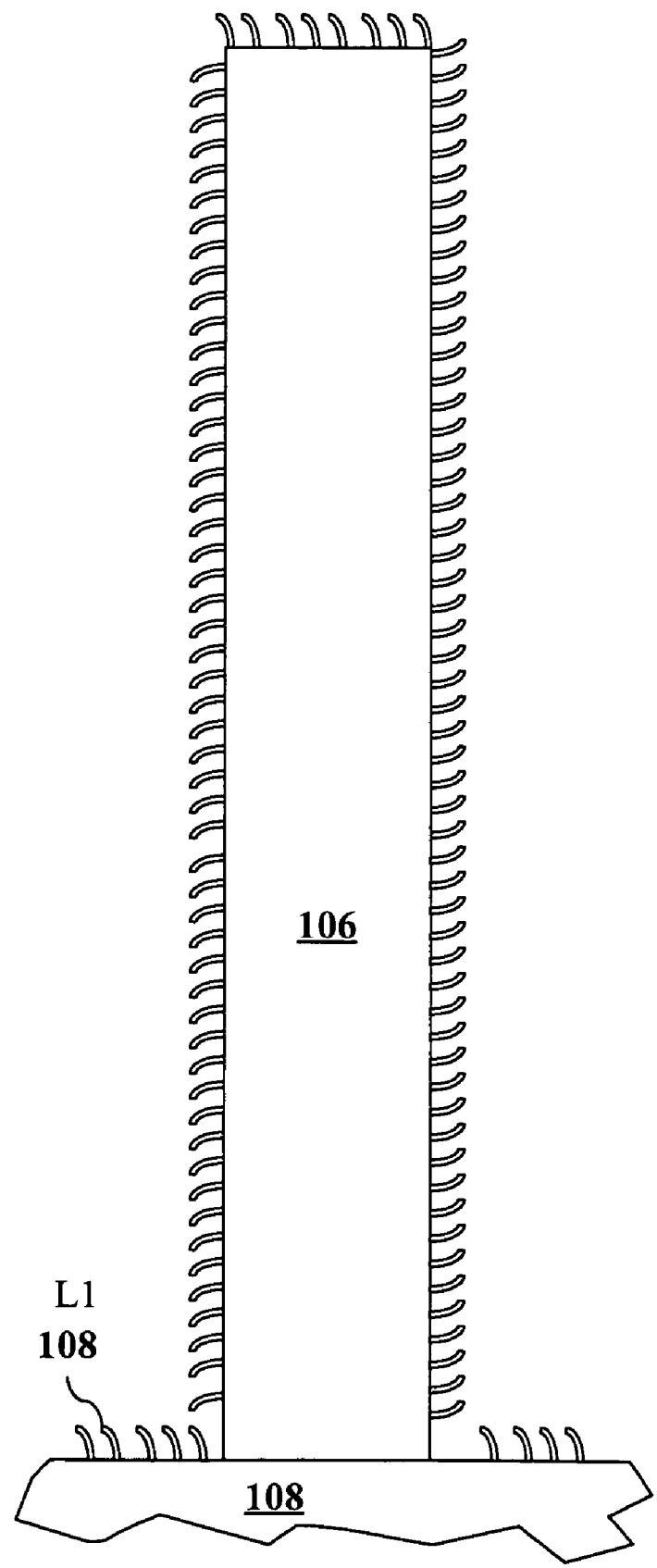
FIG. 1C illustrates a detail schematic view of a surface functionalized nanorod synthesized on transparent oxide substrate, according to a preferred embodiment of the invention.
Figure 2A:
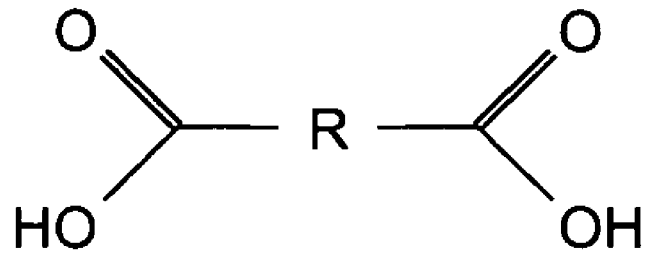
FIGS. 2A, 2B, and 2C illustrate examples of ligands of a first type used to functionalize the conductive substrate, according to a preferred embodiment of the invention.
Figure 2B:
Figure 2C:
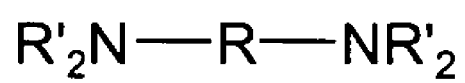

FIG. 1C illustrates a detail view of a surface functionalized nanorod 106 synthesized on transparent oxide substrate 108. The surface is functionalized with ligands 108 of the first type. Ligands 108 are may be, for example, ligands of the type shown in FIG. 2A, 2B, or 2C. In these figures, R represents an alkyl ($C_1$-$C_6$), an aromatic group (i.e., para-substituted phenyl group), or nothing. In one embodiment, carboxylic acid groups are applied to the functionalized substrate surface to make its ligands electron poor.

Figure 3A:
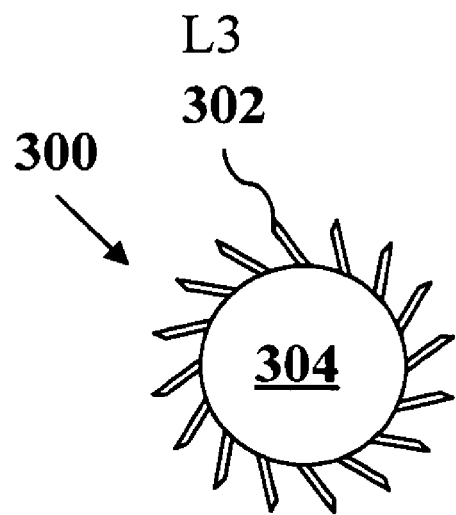
FIG. 3A is a schematic illustration of a nanoparticle that is surface functionalized with ligands of a third type, according to a preferred embodiment of the invention.

In another step of the method, illustrated in FIG. 3A, nanoparticles such as nanoparticle 300 are surface functionalized with ligands 302 of a third type. Nanoparticle 300 preferably has a nanoparticle core 304 and ligand shell 306 attached to the surface of the nanoparticle core 304. Ligands 302 preferably have an oleic acid termination. Ligands originally bonded to the nanoparticle are oleic acid or octanoic acid for PbSe and PbS core materials. For use of InSb core materials, the outer ligand used is octylamine or oleylamine.

Figure 3B:
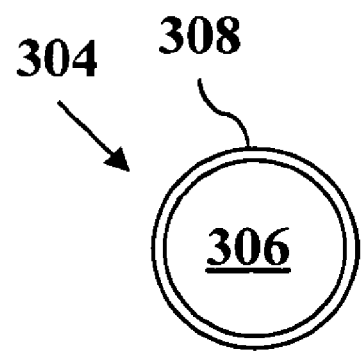
FIG. 3B is a schematic illustration of a nanoparticle core having an inner core material and shell material, according to a preferred embodiment of the invention.

The nanoparticle core 304 preferably is composed of an inner core material 306 surrounded by a shell material 308, as shown in FIG. 3B. The shell material's band gap is preferably larger than the inner core material's band gap. The shell material may be, for example, ZnS, ZnSn, CdS, or CdSn.

The core nanoparticle may be produced in a variety of ways. Following is one example of such a method. First, 0.36 g (1.6 mmol) PbO is dissolved in 8.0 mL (7.1 g, 25 mmol) oleic acid (cis-9-octadecanoic acid, 90% tech. grade from Aldrich) and heated under vacuum at about 100° C. to drive off water and form lead oleate. Once all the water has been removed, the flask is back-filled with nitrogen, and the temperature is raised to 130° C. At this stage, 8 mL of a 0.1 M solution* of bis-(trimethylsilyl)sulfide (from Aldrich) in 1-octadecene (90%, tech. grade from Aldrich) is quickly injected into the stirring mixture of Pb-oleate, initiating nucleation of PbS nanocrystal growth. Immediately after injection, the heat is removed, and the flask is left stirring as it slowly cools to room temperature. The crude nanocrystal solution is purified by a series of precipitation-centrifugation-resuspension steps. Nanocrystals are precipitated with methanol (2.5 mL), centrifuged to remove supernatant, and then redissolved in toluene (1 mL). This procedure is then repeated, this time precipitating with 3.5 mL methanol. Note that the 1-octadecene is heated under vacuum for about 1 hr to drive off any accumulated water, then cooled, prior to adding the 168 uL of TMS.

Figure 4:
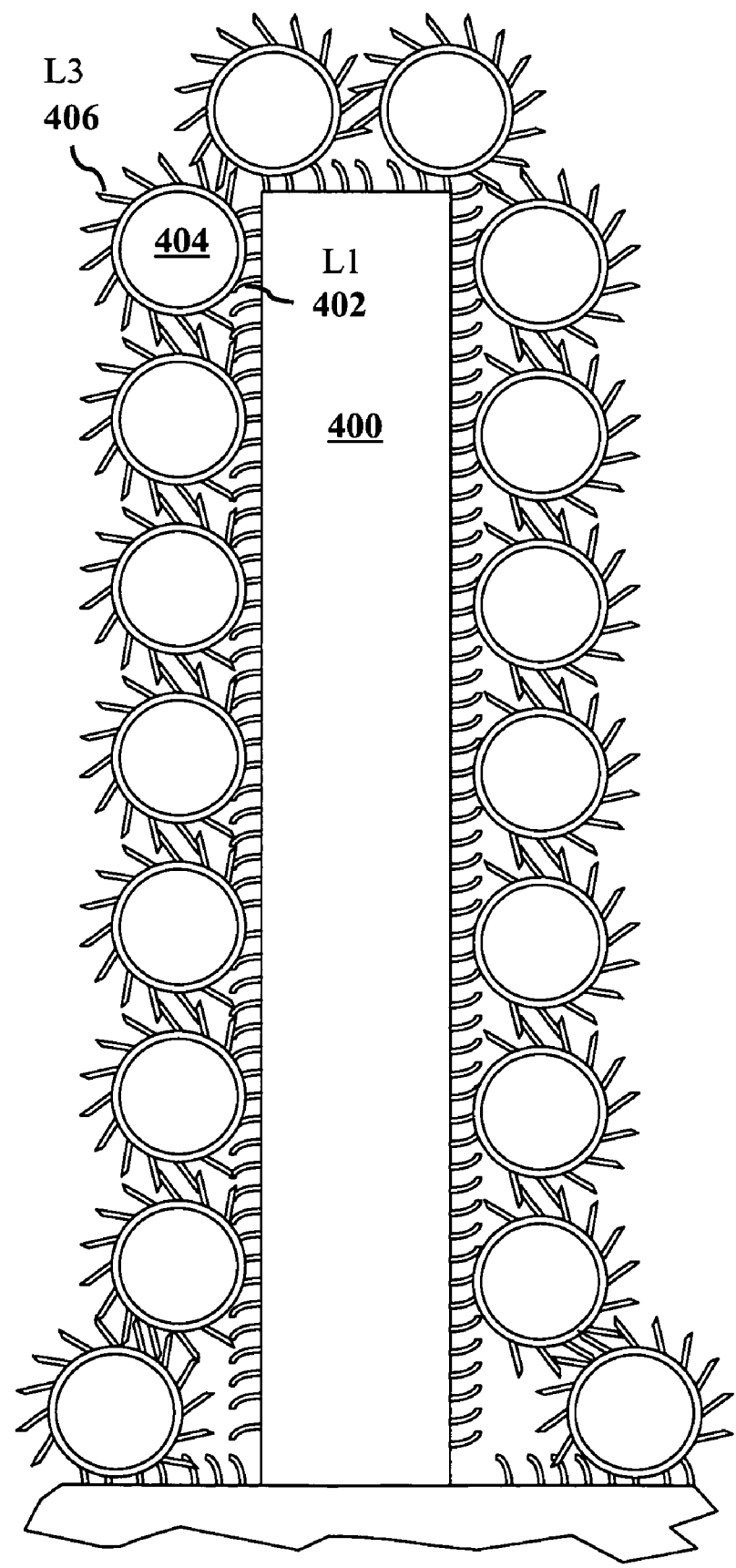
FIG. 4 is a schematic illustration of a plurality of functionalized nanoparticles adhered to a functionalized conductive substrate by ligand exchange, according to a preferred embodiment of the invention.

In a subsequent step of the method, the surface functionalized nanoparticles (FIG. 3A) are adhered to the surface functionalized conductive substrate (FIG. 1C) by ligand exchange (i.e., metathesis) of a portion of the ligands of the third type 302 (FIG. 3A) for ligands of the first type 108 (FIG. 1C). The resulting material structure is illustrated in FIG. 4 which shows a conductive substrate composed of oxide substrate 400 functionalized with ligands 402 of the first type. Nanoparticle core 404 functionalized with ligands 406 of a third type is adhered to the functionalized substrate by ligands of the first type 402. A portion of original ligands of the third type previously bonded to the surface of nanoparticle core 404 have been exchanged for the ligands of the first type that are bonded to the substrate, thereby adhering the nanoparticles to the substrate.

Figure 5:
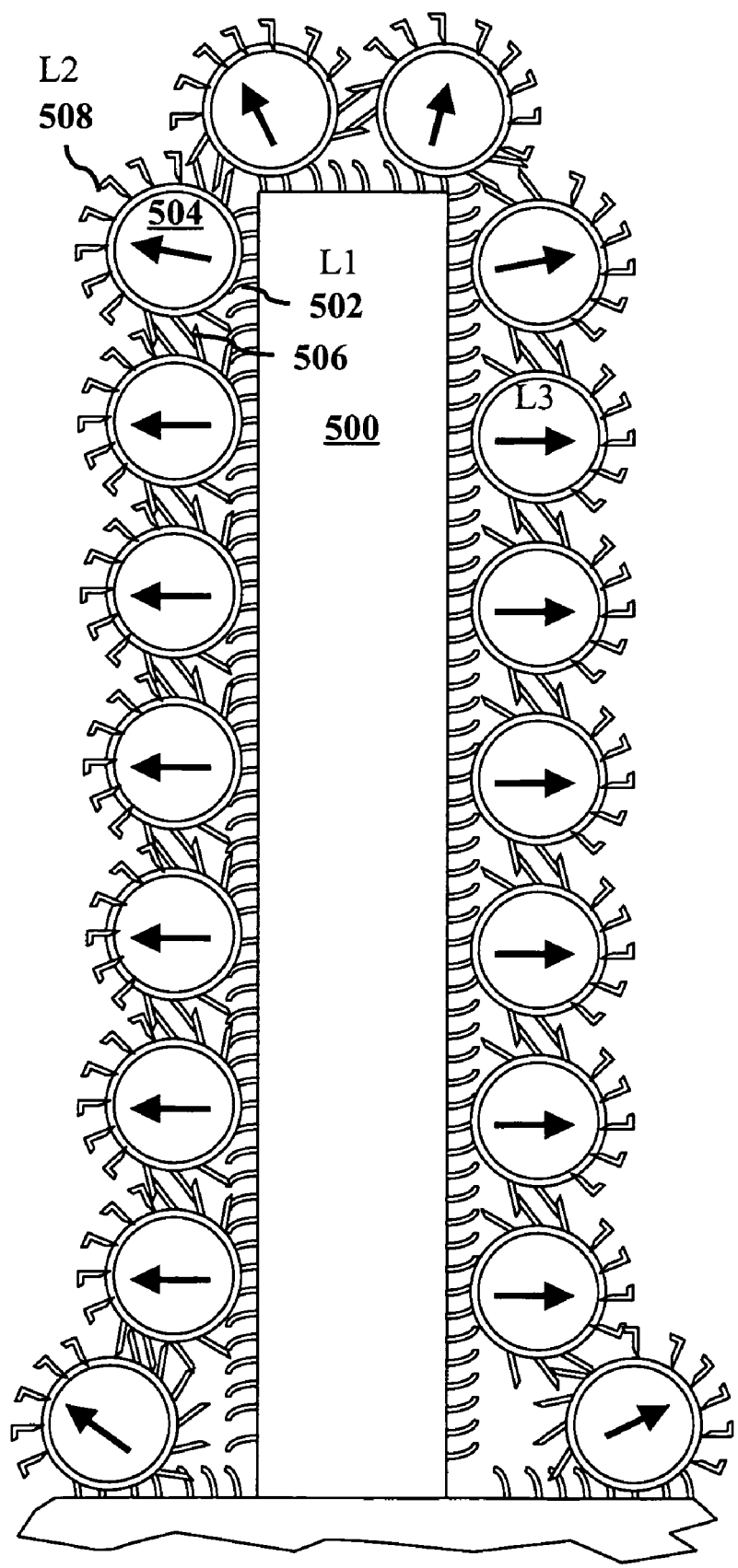
FIG. 5 is a schematic illustration of the material structure of FIG. 4 after a portion of ligands of a third type bonded to the nanoparticles have been exchanged for ligands of a second type, according to a preferred embodiment of the invention.

In a subsequent step of the method, ligand substitution is performed in which a portion of the remaining ligands of the third type on the adhered surface functionalized nanoparticles are replaced with ligands of a second type. The resulting material structure is illustrated in FIG. 5 which shows a conductive substrate composed of oxide substrate 500 functionalized with ligands 502 of the first type. Nanoparticle core 504 originally functionalized with ligands 506 of a third type is adhered to the functionalized substrate by ligands of the first type 502. A portion of ligands 506 have been exchanged for ligands 508 of a second type which are electron rich. Ligands 508 of the second type may be, for example, ligands of the type shown in FIG. 6A, 6B, or 6C. Because the ligands 502 of the first type are electron poor and the ligands 508 of the second type are electron rich, an electric field is induced in the nanoparticle, as illustrated in FIG. 7A. Nanoparticle core 700 originally functionalized with ligands 702 of a third type is, in the end product, functionalized in the upper hemisphere (away from the substrate) by electron rich ligands 704 of the second type and functionalized in the lower hemisphere (toward the substrate) by electron poor ligands 706 of the first type. FIG. 7B illustrates the three types of ligands, represented schematically in the figures by different shapes to reflect their differences in type.

In a subsequent step, a charge-selective transport layer is introduced in electrical contact with the ligands of the second type. The resulting material structure is illustrated in FIG. 8 which shows conductive substrate composed of oxide substrate 800 and nanorods 802.

The surface functionalized nanoparticles (not shown) are adhered to the surface of the conductive substrate. A charge-selective transport layer 804 covers the nanoparticles and is in electrical contact with the ligands of the second type bonded to the nanoparticle cores. Layer 804 may be, for example, a polymeric electron transport layer (ETL) or ionic liquid. A conductive electrode may be attached to the layer 804 to permit built-up charge to be accessed by a circuit external to the device.

Thus, a photovoltaic device is provided that includes a conductive substrate, preferably made of a transparent conductive oxide 800 and a plurality of metal oxide nanorods 802, and a charge selective transport layer 804. The device also includes nanoparticles 504 attached to the transparent conductive substrate 500, as shown in FIG. 5, so that they are sandwiched between the substrate and the charge selective transport layer. The nanoparticles 504 are adhered to the substrate 500 and are in electrical contact with the charge selective transport layer. As shown in FIG. 7A, each of the nanoparticles preferably has a nanoparticle core 700 and a ligand shell attached to the nanoparticle core. The ligand shell has two types of ligands. The ligands 706 of the first type are electron poor and attached to one hemisphere of the nanoparticle core, while the ligands 704 of the second type are electron rich and attached to an opposite hemisphere of the core. Consequently, the ligand shell induces an electric field within the nanoparticle. The ligand shell may also have a third type of ligand 702. The ligands of the first type bond the nanoparticles to the conductive substrate, while the ligands of the second type provide electrical contact between the nanoparticles and the charge selective transport layer.

Additionally, the nanoparticle core 304 preferably is composed of an inner core material 306 surrounded by a shell material 308, as shown in FIG. 3B. The shell material's band gap is larger than the inner core material's band gap.

Multi-exciton generation is a method that allows for an efficiency of solar cells exceeding the limit outlined by Shockley and Queiser, which is based on the assumption of the formation of just one exciton per photon. Due to Coulombic interactions and effects, the rate of recombination of generated multi-excitons greatly exceeds the rate at which they may be extracted. Stabilization of the resultant multi-excitons is accomplished through the formation of a dipole within a nanoparticle.

The device operation is as follows: Irradiation of the device occurs through the transparent conductive oxide at which point absorption of that light occurs by the nanoparticle. In those situations where multiple excitons are not generated, an exciton within the nanoparticle is formed. Due to the induced dipole placed on the nanoparticle, the field causes the exciton to align itself within that field, increasing the stability of the generated exciton. At this point, charge separation then occurs. The hole from the generated exciton flows towards the electron donating ligand while the electron from the exciton flows towards the electron accepting ligand. The device now exhibits charge separation of the exciton. Once charge separation occurs, holes are then transported through the outer portion of the ligand (L2) and through the transport layer which consists of either an ionic liquid or a hole trasport layer (HTL). The hole is then collected by the cathode which is made up of a reflective metal backing (such as silver, aluminum, molybdenum) while the electron is then transported through the first ligand (L1) and collected through the transparent conductive oxide material which acts as the anode.

The invention clamed is:

1. A photovoltaic device comprising:
   a) a conductive substrate surface functionalized with a ligand of a first type;
   b) a charge selective transport layer; and
   c) a plurality of nanoparticles sandwiched between the conductive substrate and the charge selective transport layer;
   wherein the plurality of nanoparticles is adhered to the conductive substrate and is in electrical contact with the charge selective transport layer;
   wherein the plurality of nanoparticles comprises a nanoparticle comprising a nanoparticle core and a ligand shell attached to the nanoparticle core, wherein the ligand shell comprises ligands of a first type and ligands of a second type, wherein the ligands of the first type are attached to a first hemisphere of the nanoparticle core, wherein the ligands of the second type are attached to a second hemisphere of the nanoparticle core, wherein the first hemisphere is opposite the second hemisphere, wherein the ligands of the first type are an electron poor ligand type, and wherein the ligands of the second type are an electron rich ligand type, whereby the ligand shell induces an electric field within the nanoparticle;
   wherein the ligands of the first type bond the nanoparticles to the conductive substrate;
   wherein the ligands of the second type provide electrical contact between the nanoparticles and the charge selective transport layer.

2. The photovoltaic device of claim 1 wherein the conductive substrate comprises:
   a) a transparent conductive oxide and
   b) a plurality of metal oxide nanorods fabricated on the transparent conductive oxide.

3. The photovoltaic device of claim 1 wherein the nanoparticle core comprises an inner core comprising an inner core material surrounded by a shell comprising a shell material, wherein the shell material has a shell band gap and the inner core material has a inner core band gap, and wherein the shell band gap is larger than the inner core band gap.

4. A method for making a photovoltaic device, the method comprising:
   surface functionalizing a conductive substrate with bifunctional ligands of a first type;
   surface functionalizing nanoparticles with ligands of a third type;
   adhering the surface functionalized nanoparticles to the surface functionalized conductive substrate by ligand exchange of a portion of the ligands of the third type for ligands of the first type;
   performing ligand substitution to replace a portion of the ligands of the third type on the adhered surface functionalized nanoparticles with ligands of a second type; and
   introducing a charge-selective transport layer in electrical contact with the ligands of the second type;
   wherein the ligands of the first type are of distinct type from the ligands of the second type, wherein the ligands of the first type are of distinct type from the ligands of the third type, and wherein the ligands of the second type are of distinct type from the ligands of the third type;
   wherein the ligands of the first type are electron poor and the ligands of the second type are electron rich.

5. The method of claim 4 further comprising synthesizing metal oxide nanorods on a transparent conductive oxide to produce the conductive substrate.

* * * * *